Oct. 15, 1963 J. K. HUNTON ETAL 3,107,335

HIGH FREQUENCY TRANSMISSION LINE HAVING VARIABLE ABSORPTION USING VARIABLY BIASED SEMICONDUCTOR DEVICES SHUNTING THE LINE

Filed Sept. 29, 1961

INVENTORS
JAMES K. HUNTON
AUBER G. RYALS
BY J. C. Chapman
ATTORNEY 3,107,335

HIGH FREQUENCY TRANSMISSION LINE HAVING VARIABLE ABSORPTION USING VARIABLY BIASED SEMICONDUCTOR DEVICES SHUNTING THE LINE

James K. Hunton, Los Altos, and Auber G. Ryals, Palo Alto, Calif., assignors to Hewlett-Packard Company, Palo Alto, Calif., a corporation of California Filed Sept. 29, 1961, Ser. No. 141,661
10 Claims. (Cl. 333—31)

Figures 1, 2, 3:
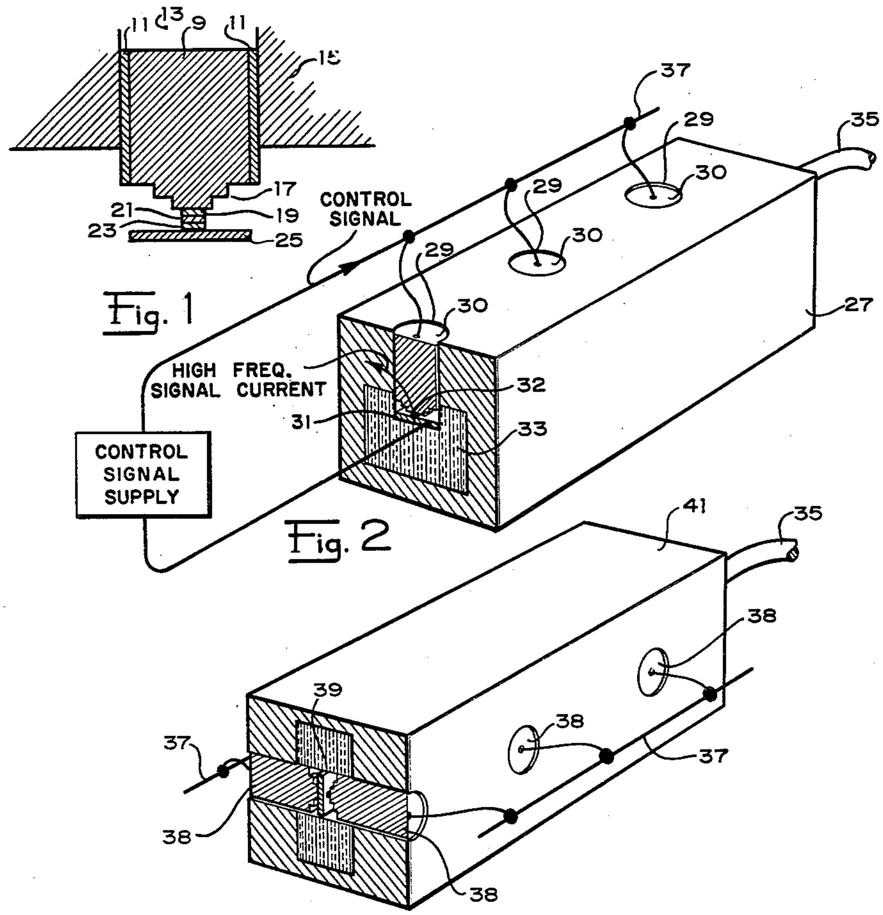

This invention relates to high frequency signalling apparatus and more particularly to apparatus for modulating and attenuating microwave signals.

Certain microwave signal sources require signal attenuation to provide substantially constant output signals of calibrated power for instrumentation and testing applications. For example, when these signal sources are operated over a range of frequencies the output of power changes with frequency and thus attenuation is required to maintain the output level constant with frequency. Signal attenuation can be readily achieved in some signal sources by applying to some control electrode a voltage that is related to the output power. Mechanical attenuators are often used with other signal sources which are not conveniently controllable by a voltage that is related to output power. In addition to the cumbersome size and weight generally associated with mechanical attenuators, these devices have the added disadvantage of requiring critical dimensional tolerances for proper operation. Also, mechanical attenuators generally cannot respond rapidly to changes in applied signal power to maintain the output power substantially constant.

In other applications, such as in radar and in communications work, attenuation of a fixed microwave frequency signal is required at periodic intervals to provide pulsed microwave energy. High on-to-off signal transmission ratios are essential for preserving the distinction between transmission states in the presence of noise. In addition, rapid changes from the on to the off transmission states (of the order of ten millimicroseconds) are essential for preserving the information about time displacement of pulses of the microwave energy. Certain known point contact semi-conductor switches are presently used in transmission lines to modulate microwave signals by alternately providing a short circuit and an open circuit in the signal transmission path. Although rapid transition from the on to the off transmission states can be readily achieved by these devices, they provide only relatively low on-to-off transmission ratios and cause several line mismatches in the off transmission state.

It is therefore an object of the present invention to provide high frequency apparatus which changes signal attenuation in response to applied control signals of varying amplitude.

It is another object of the present invention to provide a broadband high frequency signal attenuator having signal attenuation that is related to the amplitude of an applied signal.

It is still another object of the present invention to provide a microwave signal attenuator which provides a high on-to-off transmission ratio in response to applied control signals and which provides a good line match in the off transmission state.

In accordance with the illustrated embodiment of the present invention, a plurality of circuit elements are disposed along the length of a transmission line at quarter wave length increments as measured at the design center frequency of the operative band. The circuit elements comprise diffused junction semiconductor diodes. Each of these diodes has a thin layer of intrinsic conductivity material between adjacent layers of P-type conductivity and N-type conductivity materials. At microwave frequencies, these diodes operate not as rectifiers but rather as linear resistors having a resistance value that is determined by the construction geometry and the conduction current. Thus, by properly selecting the dimensions of the diodes and the amplitude of the conduction current for each diode, it is possible to match the characteristic impedance of the transmission line at quarter wavelength intervals using the resistance of the diodes. Reflections in the off transmission state can thereby be materially reduced. Signal attenuation can be continuously varied from the off transmission state to the on transmission state by the application of forward conduction current of varying amplitude to each of the diodes in the attenuator. The speed with which the signal attenuation may be changed is primarily dependent upon the switching characteristics of the diodes and the waveform of the applied conduction current.

Figure 4:
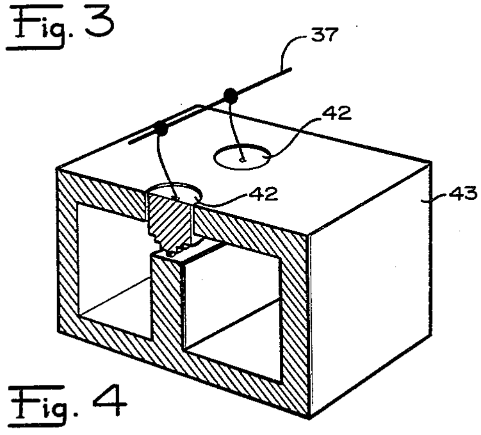

Other and incidental objects of the present invention will be apparent from a reading of this application and an inspection of the accompanying drawing in which:

FIGURE 1 is a sectional view of a circuit element,

FIGURE 2 is a perspective view of an embodiment of the present invention showing an unsymmetrical array of circuit elements along a strip line, FIGURE 3 is a perspective view of an embodiment of the present invention showing a symmetrical array of circuit elements along a strip line, and FIGURE 4 is a perspective view of an embodiment of the present invention showing an array of circuit elements along the narrow gap of a ridged wave guide.

Referring now to FIGURE 1, there is shown a cross-sectional view of a circuit element of the present invention. An aluminum post 9 having an anodized outer surface 11 is fitted in the opening 13 of a conductive envelope 15. The lower portion of post 9 is a tapered or step-like transition region 17 which reduces the cross-sectional area of the lower end surface to provide the proper post impedance. A semiconductor device having three layers of different conductivity materials is attached to the lower end surface of post 9. The semiconductor device comprises a first layer 19 of P-type conductivity material, a second layer 21 of intrinsic conductivity material and a third layer 23 of N-type conductivity material. The planar surface of layer 23 is held in contact with the surface of conductor 25. The capacitor comprising post 9, insulator 11 and the inner surface of opening 13 serves to pass the high frequency current without affecting the D.C. bias current. Thus, the circuit element which shunts the transmission line comprises a conductive body or post, a high frequency by-pass capacitor between the conductive body and the surrounding structure, a section of tapered line and a P.I.N. diode attached to the tapered line.

The P.I.N. diode is a double diffused junction semiconductor device which operates as a rectifier at low frequencies. At frequencies of the order of 100 megacycles, these diodes operate not as rectifiers but rather as linear resistors having a resistance that is related to the D.C. bias current and to the dimension of the layer of intrinsic conductivity material. It is possible to design the linear resistors for operation at substantially the value of the characteristic impedance of a transmission line. The arrangement of these circuit elements in the apparatus of the present invention thus serves to reduce reflections to a minimum and provide power attenuation values of approximately 4 to 5 decibels per circuit element.

Referring now to FIGURE 2, a portion of a conductive envelope 27 for high frequency energy is shown in perspective view. The openings 29 in the envelope 27, each containing a circuit element 30 as described in FIGURE 1, are spaced at quarter wavelength increments along the length of envelope 15. The quarter wavelength spacing is determined at the midband frequency of the apparatus. The strip line or conductor of high frequency energy 31 is held in place by a suitable dielectric material 33. A cable 35 for conducting high frequency energy is suitably attached to the envelope 27 and to the conductor 31 for delivering the energy from a signal source to the apparatus.

The conductor 31 is positioned near one of the inside walls of the envelope 27. This concentrates the electric field in the region between the conductor 31 and the nearest inner wall of the envelope 27 and rarifies the electric field in remaining regions within the envelope 27. Circuit elements similiar to those of FIGURE 1 are spaced at quarter wavelength increments along the length of the envelope 27. These circuit elements are held in contact with the conductor 31 by suitable mounting means and are disposed to shunt the electric field within the region of concentrated field. When no forward bias current is provided for the diodes 32 of the circuit element, the concentrated electric field between the conductor 31 and the inner wall of envelope 27 remains relatively unaffected. When forward bias current is provided for the diodes 32 of the circuit elements through electrical connection means 37, the diodes show a resistance value that is related to the current therethrough. Each of the circuit elements 30 thus serves to shunt the electric field substantially at quarter wavelength intervals. High frequency current flows in the low impedance path between the conductor 31 and envelope 27, which path comprises the P, I and N layers of the diode 32, and the post and by-pass capacitor of circuit element 30. Reflections at each of the quarter wavelength increments are materially reduced by operating the diodes between the maximum resistance and the resistance that is substantially equal to the characteristic impedance of the strip line. In addition, since reflections are also attenuated by each of the circuit elements 30, the amplitude of reflections originating near the center of the apparatus is reduced to a negligible value at the end terminals. Thus, by properly choosing diodes to provide tapering resistance into and out of the apparatus for a given bias current, reflections are further reduced. The unsymmetrical loading arrangement of a strip line using the circuit elements of FIGURE 1 has a substantially flat frequency response over a broadband of frequencies extending to about four kilomegacycles.

Referring now to FIGURE 3 there is shown a perspective view of a portion of the signalling apparatus having a symmetrical arrangement of circuit elements 38. As previously discussed in connection with the apparatus of FIGURE 2, the electric field is concentrated in a limited region between the center conductor 39 and the nearest inner walls of envelope 41. In this arrangement of circuit elements 38, the electric fields are concentrated in regions on both sides of conductor 39. Circuit elements 38 in each of the openings in the envelope 41 are held in contact with the conductor 39 by suitable mounting means and are disposed to shunt the electric field in the regions of concentrated electric field. This symmetrical loading arrangement which uses circuit elements disposed at quarter wavelength increments along the envelope 41 has a substantially flat frequency response over a broadband of frequencies extending to about eight kilomegacycles. It is believed that the symmetrical arrangement of circuit elements 38 decreases the effective path length of the high frequency current circulating within the envelope 41. The decreased path length reduces the effective inductance in the high frequency current path and this increases the value of the cut off frequency of the apparatus.

The apparatus of FIGURE 4 is a section of ridged waveguide having a plurality of circuit elements spaced at quarter wavelength increments along the length of the guide as measured at the center frequency of the operating band. The ridge in the waveguide serves to concentrate the electric field in the limited region of the gap between the upper ridge surface and the opposite guide wall. Each of the circuit elements 42 thus serves to shunt the electric field in the limited region of the gap within envelope 43. This apparatus has a substantially flat frequency response over the band of frequencies from 4 to 12.4 kilomegacycles. A similar arrangement of circuit elements in smaller ridged waveguide operates satisfactorily to frequencies of the order of 20 kilomegacycles.

In each of the embodiments of the present invention shown in FIGURES 2, 3 and 4, attenuation of the high frequency energy is increased by increasing the forward conduction current provided by the electrical connection means 37. Thus, by changing the amplitude of the applied conduction current rapidly from the value required for maximum attenuation to the value required for minimum attenuation, it is possible to provide pulsed microwave energy. This modulation process can produce pulse rise times of the order of ten millimicroseconds and on-to-off transmission ratios of the order of four to five decibels per circuit element. The ratio provided is thus determined by the number of circuit elements used in the apparatus.

Therefore, the apparatus of the present invention provides signal controlled attenuation with a minimum of energy reflection due to line mismatches. In addition, the attenuation provided by the present apparatus changes rapidly for changes in applied control signals and hence the apparatus may be used to modulate microwave signals. High on-to-off transmission ratios can be realized without causing severe line mismatches in the off transmission state. Further, good standing wave ratios and attenuation flatness may be obtained over a broadband of operating frequencies with each of the particular embodiments of the present invention.

We claim:

1. High frequency signal apparatus comprising the combination of an envelope having a dielectric therein for conducting electrical energy, means for concentrating the electric field in limited regions within the envelope, a plurality of circuit elements spaced at quarter wavelength increments and being disposed within said limited regions to shunt the electric fields therein, each of said circuit elements having a region of tapering cross section near the end thereof disposed within said limited region and being capacitively connected to the envelope, each of said circuit elements having a semiconductor device attached to the lower end of said region of tapering cross section, the semiconductor device having regions of intrinsic conductivity material between adjacent regions of P-type conductivity and N-type conductivity materials, and electrical connection means to apply signal of variable amplitude to each of said circuit elements.

2. Signalling apparatus comprising the combination of an envelope and a conductor therein, a plurality of circuit elements spaced at quarter wavelength increments along said envelope, each of said circuit elements including a semiconductor device having a layer of intrinsic conductivity material between adjacent layers of P-type conductivity and N-type conductivity materials, the semiconductor devices being in electrical contact with the conductor, and electrical connection means to apply direct current signal of variable amplitude to each of the circuit elements.

3. Signalling apparatus comprising the combination of a conductive envelope and a conductor therein for transmitting electrical energy, a plurality of circuit elements spaced at quarter wavelength increments along said envelope, each of said circuit elements having a region of tapering cross section and a semiconductor device connected between the lower end of said region and the conductor, the semiconductor device having a layer of intrinsic conductivity material between adjacent layers of P-type conductivity and N-type conductivity materials, and electrical connection means to apply direct current signal of variable amplitude to each of the circuit elements.

4. Signalling apparatus comprising the combination of a conductive envelope and a conductor therein for transmitting electrical energy, a plurality of circuit elements on opposite sides of the conductor and spaced at predetermined intervals therealong, each of said circuit elements having a region of tapering cross section and a semiconductor device connected between the lower end of said section and the conductor, the semiconductor device having a layer of intrinsic conductivity material between adjacent layers of P-type conductivity and N-type conductivity materials, means connecting the circuit elements and the envelope and electrical connection means to apply direct current signal of variable amplitude to each of the circuit elements.

5. Signalling apparatus comprising the combination of a conductive envelope and a conductor therein for transmitting electrical energy, a plurality of circuit elements on opposite sides of the conductor and spaced at quarter wavelength increments therealong, each of said circuit elements being capacitively connected to the envelope and having a region of tapering cross section and a semiconductor device connected between the lower end of said section and the conductor, the semiconductor device having a layer of intrinsic conductivity material between adjacent layers of P-type conductivity and N-type conductivity materials, and electrical connection means to apply direct current signal of variable amplitude to each of the circuit elements.

6. Signalling apparatus comprising the combination of a conductive waveguide envelope and a dielectric therein for transmitting microwave energy, means to concentrate the electric field in a limited region within said waveguide envelope, a plurality of circuit elements spaced at quarter wavelength increments along said envelope and disposed to shunt the electric field within said limited region, each of said circuit elements being capacitively connected to the envelope and including a semiconductor device, the semiconductor device having a layer of intrinsic conductivity material between adjacent layers of P-type conductivity and N-type conductivity materials, and electrical connection means to apply signal of variable amplitude to each of the circuit elements.

7. Signalling apparatus comprising the combination of a conductive waveguide envelope and a dielectric therein for transmitting microwave energy, a ridge in the envelope to concentrate the electric field in the limited region between the upper ridge surface and the opposite guide wall, a plurality of circuit elements spaced at quarter wavelength increments along said envelope and disposed to shunt the electric field within said limited region, each of said circuit elements being capacitively connected to the envelope and including a semiconductor device, the semiconductor device having a layer of intrinsic conductivity material between adjacent layers of P-type conductivity and N-type conductivity materials, and electrical connection means to apply direct current signal of variable amplitude to each of the circuit elements.

8. A waveguide attenuator comprising the combination of a ridge waveguide envelope and a dielectric therein for transmitting microwave energy primarily in the gap above the waveguide ridge, a plurality of circuit elements spaced at quarter wavelength increments along said envelope and disposed to shunt the electric field in said gap, each of said circuit elements having a region of tapering cross section and a semiconductor device connected between the lower end of said region and the ridge, the semiconductor device having a layer of intrinsic conductivity material between adjacent layers of P-type conductivity and N-type conductivity materials, and electrical connection means to apply direct current signal of variable amplitude to each of the circuit elements.

9. A waveguide attenuator according to claim 8 wherein the circuit elements are capacitively connected to said envelope.

10. High frequency signal apparatus comprising the combination of an envelope having a dielectric therein for conducting electrical energy, means for concentrating the electric field in a limited region within the envelope, a plurality of semiconductor devices located within said envelope along the length thereof, each of said semiconductor devices being disposed within said limited region to shunt the electric field therein, said semiconductor devices having regions of intrinsic conductivity material between adjacent regions of P-type conductivity and N-type conductivity materials and having substantially constant resistance for a given control signal applied thereto over a cycle of said high frequency signal, means connecting one of the P-type and N-type regions of said semiconductor device to said envelope, and means to apply a control signal of variable amplitude to the other of said regions of each of said semiconductor devices.

References Cited in the file of this patent

UNITED STATES PATENTS

| | | |
|---|---|---|
| 2,151,118 | King | Mar. 21, 1939 |
| 2,197,123 | King | Apr. 16, 1940 |
| 2,444,060 | Ohl | June 29, 1948 |
| 2,679,585 | Drazy | May 25, 1954 |
| 2,912,581 | De Lange | Nov. 10, 1959 |
| 2,939,005 | Vogelman | May 31, 1960 |
| 2,984,795 | Robillard | May 16, 1961 |
| 3,008,089 | Uhlir | Nov. 7, 1961 |
| 3,064,210 | Steele | Nov. 13, 1962 |